United States Patent
Hong

(10) Patent No.: US 7,834,787 B2
(45) Date of Patent: Nov. 16, 2010

(54) TECHNIQUES FOR DELAY COMPENSATION OF CONTINUOUS-TIME SIGMA-DELTA MODULATORS

(75) Inventor: Merit Y. Hong, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 15 days.

(21) Appl. No.: 12/350,492

(22) Filed: Jan. 8, 2009

(65) Prior Publication Data

US 2010/0171643 A1 Jul. 8, 2010

(51) Int. Cl.
*H03M 1/00* (2006.01)

(52) U.S. Cl. ................................ 341/143; 341/200
(58) Field of Classification Search .................. 341/143
See application file for complete search history.

(56) References Cited

U.S. PATENT DOCUMENTS

| | | | | |
|---|---|---|---|---|
| 6,346,898 B1 * | 2/2002 | Melanson | .................. | 341/143 |
| 6,909,394 B2 * | 6/2005 | Doerrer et al. | .............. | 341/200 |
| 7,221,303 B1 * | 5/2007 | Melanson | .................... | 341/143 |
| 7,453,381 B2 * | 11/2008 | Doerrer et al. | .............. | 341/143 |
| 7,535,392 B2 * | 5/2009 | Weng et al. | .................. | 341/143 |
| 2005/0068213 A1 | 3/2005 | Fontaine et al. | | |

OTHER PUBLICATIONS

Schreier et al., Understanding Delta Sigma Converters, 2 pages provided, Wiley-IEEE Press, Nov. 2004.

* cited by examiner

*Primary Examiner*—Khai M Nguyen
(74) *Attorney, Agent, or Firm*—Dillon & Yudell LLP

(57) ABSTRACT

A technique for implementing compensatory feedback in a continuous-time sigma-delta modulator includes providing, based on an analog input signal, a digital output signal at an output of a quantizer circuit of the continuous-time sigma-delta modulator. A functionality of the quantizer circuit is then controlled based on the digital output signal.

12 Claims, 4 Drawing Sheets

TECHNIQUES FOR DELAY COMPENSATION OF CONTINUOUS-TIME SIGMA-DELTA MODULATORS

BACKGROUND

1. Field

The present disclosure is directed to a sigma-delta modulator and, more specifically, to techniques for delay compensation of continuous-time sigma-delta modulators.

2. Related Art

Broadly, sigma-delta modulation refers to a technique for encoding high resolution signals into lower resolution signals using pulse-code modulation. Sigma-delta modulation is increasingly employed in a wide range of electronic components, e.g., digital-to-analog converters (DACs), analog-to-digital converters (ADCs), frequency synthesizers, switch-mode power supplies, and motor controls. A DAC or ADC that implements sigma-delta modulation can achieve relatively high resolution while being manufactured using low-cost complementary metal-oxide semiconductor (CMOS) processes.

Compensatory feedback for a continuous-time sigma-delta modulator has traditionally been implemented in the analog domain (i.e., prior to quantization) or in the digital domain (i.e., subsequent to quantization). Unfortunately, continuous-time sigma-delta architectures that implement compensatory feedback in the analog domain are usually limited by analog summer performance, due to the fact that the analog summer is required to sum high frequency digital with nominally low frequency analog. Moreover, higher digital clock frequencies impose larger bandwidth requirements on an analog summer. As such, applying compensatory feedback in the analog domain (i.e., prior to quantization) requires a relatively expensive analog summer.

With reference to FIG. 1, a block diagram of a relevant portion of a conventional continuous-time sigma-delta modulator 100, that implements delay compensation in the analog domain, is illustrated. As is shown in FIG. 1, the modulator 100 includes an analog loop filter block 102 that receives an analog input signal and a standard digital feedback signal. The block 102 provides one or more analog outputs (depending on an analog loop filter implementation) to one or more respective inputs of an analog summer 104. Another input of the analog summer 104 receives (from a compensation block 108) a compensatory digital feedback signal D1 (which includes n-bits). The analog summer 104 sums the input signals and provides an analog output signal to an input of a quantizer 106, which provides an n-bit digital output signal that represents the analog input signal.

As is shown in FIG. 1, a compensatory feedback path includes the compensation block 108, which delays a digital output signal by 'k' time delays and scales the digital output signal by a weighting factor $a_k$. Similarly, a standard feedback path includes a feedback block 110, which delays a digital output signal by 'j' time delays and scales the digital output signal by a weighting factor $b_j$. The blocks 108 and 110 may also be configured to sum multiple delayed scaled digital output signals. As noted above, higher digital clock frequencies for the feedback signal D1 impose relatively large bandwidth requirements on the analog summer 104 and, as such, require a relatively high performance analog summer.

An example of a continuous-time sigma-delta modulator that implements delay compensation (compensatory feedback) entirely in the digital domain (i.e., subsequent to quantization) is disclosed in U.S. Patent Application Publication No. 2005/0068213 (hereinafter "the '213 application"), assigned to Texas Instruments Incorporated. However, employing the approach disclosed in the '213 application also has drawbacks, as it may be difficult to align digital levels with analog levels (as a digital step size does not generally match analog levels) and the approach is generally impractical for continuous-time sigma-delta modulators that employ quantizers that provide a small number of bits (e.g., two or fewer bits).

With reference to FIG. 2, a block diagram of a relevant portion of a conventional continuous-time sigma-delta modulator 200, that implements delay compensation in the digital domain, is illustrated. As is shown in FIG. 2, the modulator 200 includes an analog loop filter block 202 that receives an analog input signal and a standard digital feedback signal. The block 202 provides one or more analog output signals (depending on the analog loop filter implementation) to one or more respective inputs of an analog summer 204. The analog summer 204 sums the analog output signals and provides a summed analog signal to an input of an n-bit quantizer 206. The quantizer 206 provides an n-bit digital output signal (that is representative of a level of the analog input signal) to respective inputs of digital summer 208.

As is shown in FIG. 2, a compensatory feedback path includes a compensation block 210 that delays an n-bit digital output signal by 'k' time delays and scales the digital output signal by a weighting factor $a_k$. A compensatory digital feedback signal D2 (which includes n-bits) is provided (from the block 210) to another input of the digital summer 208. The digital summer 208 sums the inputs received from outputs of the quantizer 206 and the block 210 to provide the n-bit digital output signal. Similarly, a standard feedback path includes a feedback block 212 that delays the digital output signal by 'j' time delays and scales the digital output signal by a weighting factor $b_j$. The blocks 210 and 212 may also be configured to sum multiple delayed scaled digital output signals. It should be appreciated that when the weighting factor $a_k$ is a non-integer, the number of new analog levels that require generation increases (e.g., when the weighting factor $a_k$ is equal to 0.1, ten times more analog levels require generation). As noted above, as it is difficult to align digital levels with analog levels (as digital step size does not generally match analog levels), the approach is generally impractical for continuous-time sigma-delta modulators that employ quantizers that provide a small number of bits (e.g., two or fewer bits).

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
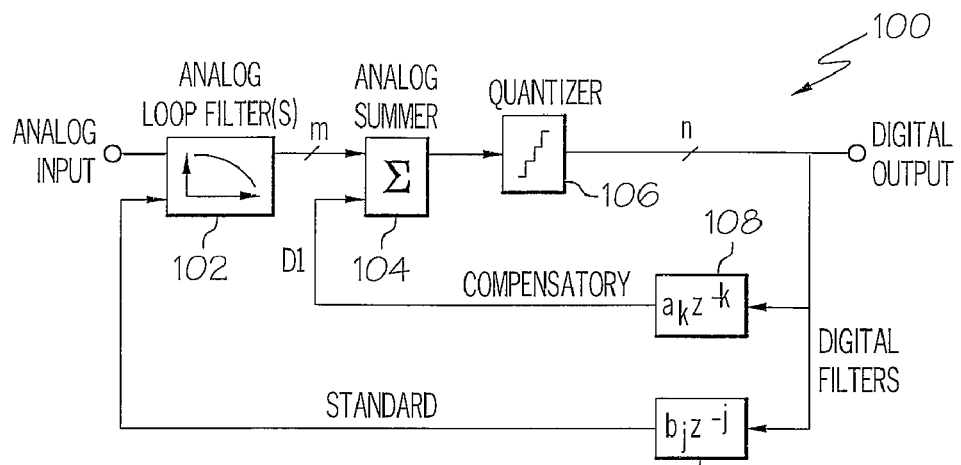
FIG. 1 is an example diagram of a relevant portion of a conventional continuous-time sigma-delta modulator.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims and their equivalents. In particular, the embodiments described below may be embodied in various devices. As used herein, the term "coupled" includes a direct electrical connection between blocks or components and an indirect electrical connection between blocks or components achieved using one or more intervening blocks or components.

In digital signal processing, quantization is the process of converting an analog input signal into an n-bit digital output signal, where 'n' is an integer greater than or equal to one. Quantization is typically performed by a quantizer, which can be, for example, realized with an N-level comparator. As one example, a one-bit quantizer may be realized with a 2-level comparator, whose output is a digital '1' if an analog input signal is positive and a digital '0' if the analog input signal is negative.

According to one or more embodiments of the present disclosure, a digital output of a continuous-time sigma-delta modulator is utilized to control quantizer functionality (of the continuous-time sigma-delta modulator) in order to compensate for time delay (as contrasted with modulating an output of a quantizer). As the quantizer physically straddles analog and digital domains, better matching of an analog level to a digital level can usually be achieved. Compensatory feedback may be applied, via a quantizer (of a continuous-time sigma-delta modulator), in a number of manners. As one example, digital selection may be employed to select a reference voltage (or a reference voltage pair) for a quantizer (see FIG. 5). As another example, multiple quantizers (each which have different reference voltages or different reference voltage pairs) may be implemented to generate all possible outcomes and digital selection may be used to choose which of the quantizers to enable at a given point in time (see FIG. 6). As yet another example, multiple quantizers (each which have different reference voltages or different reference voltage pairs) may be implemented to generate all possible outcomes and digital selection may be used to select which of the quantizers provides an output at a given point in time (see FIG. 7). In sum, applying compensatory feedback to a quantizer (which lies on the boundary between analog and digital domains) of a continuous-time sigma-delta modulator typically reduces both high analog performance requirements and digital/analog scaling issues, as compared to conventional continuous-time sigma-delta modulators.

According to one embodiment of the present disclosure, a technique for implementing compensatory feedback in a continuous-time sigma-delta modulator includes providing a digital output signal (which is based on a time-varying analog input signal) at an output of a quantizer circuit of the continuous-time sigma-delta modulator. A functionality of the quantizer circuit is then controlled based on the digital output signal.

According to another embodiment of the present disclosure, a continuous-time sigma-delta modulator includes an analog loop filter and a quantizer circuit. The analog loop filter includes an input configured to receive an analog input signal and an analog output. The quantizer circuit includes a first input coupled to the analog output of the analog loop filter, an output configured to provide a digital output signal, and a second input configured to receive a delayed scaled version of the digital output signal. The quantizer circuit is further configured to modify its functionality based on the delayed scaled version of the digital output signal.

According to yet another embodiment of the present disclosure, a technique for implementing compensatory feedback in a sigma-delta modulator includes providing, based on an analog input signal, a digital output signal at an output of a quantizer circuit of the sigma-delta modulator. A reference voltage for the quantizer circuit is then shifted based on the digital output signal. In this case, the shifted reference voltage provides an offset reference voltage for the quantizer circuit that is shifted with respect to a reference level (e.g., zero volts). The analog input signal is then quantized based on the shifted reference voltage.

Figure 3:
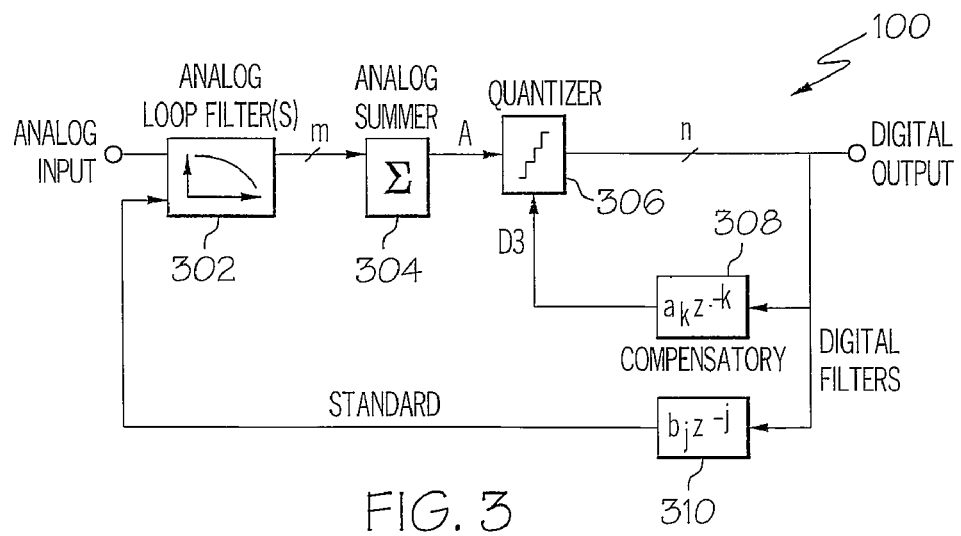
FIG. 3 is an example diagram of a relevant portion of a continuous-time sigma-delta modulator that is configured according to one embodiment of the present invention.

With reference to FIG. 3, a block diagram of a relevant portion of a continuous-time sigma-delta modulator 300 that implements delay compensation, according to various embodiments of the present disclosure, is illustrated. As is shown in FIG. 3, the modulator 300 includes an analog loop filter block 302 that receives an analog input signal and a standard digital feedback signal. The block 302 provides 'm' analog output signals to respective inputs of an analog summer 304. In the event that the analog summer 304 provides a single output, the summer 304 may be omitted. When implemented, the analog summer 304 sums the 'm' analog output signals (from the analog loop filter 302) and provides a summed analog signal to an input of an n-bit quantizer circuit 306 (where 'n' is an integer greater than or equal to one).

The quantizer circuit 306 provides an n-bit digital output signal (that is representative of a level of the analog input signal). As is shown in FIG. 3, a compensatory feedback path includes a compensation block 308 that delays the digital output signal by 'k' time delays and scales the digital output signal by a weighting factor $a_k$ to provide a compensatory digital feedback signal D3. The feedback signal D3 is provided to another input of the quantizer circuit 306, which adjusts a reference voltage offset (in one of multiple ways discussed in further detail herein) responsive to the feedback signal D3. As noted above, the compensatory digital feedback signal D3 may be scaled by a weighting factor $a_k$. However, to simplify the discussion herein, an assumption is made that the weighting factor $a_k$ has an integer value of one. A weighting factor $a_k$ having a value different than one may be achieved in various manners. A standard feedback path includes a feedback block 310 that delays the digital output signal by 'j' time delays and scales the delayed digital output signal by a weighting factor $b_j$ to provide the standard digital feedback signal. As noted above, applying compensatory feedback to a quantizer (which lies on the boundary between analog and digital domains) of a continuous-time sigma-delta modulator generally reduces both high analog performance requirements and digital/analog scaling issues, as compared to conventional continuous-time sigma-delta modulators.

Figure 4:
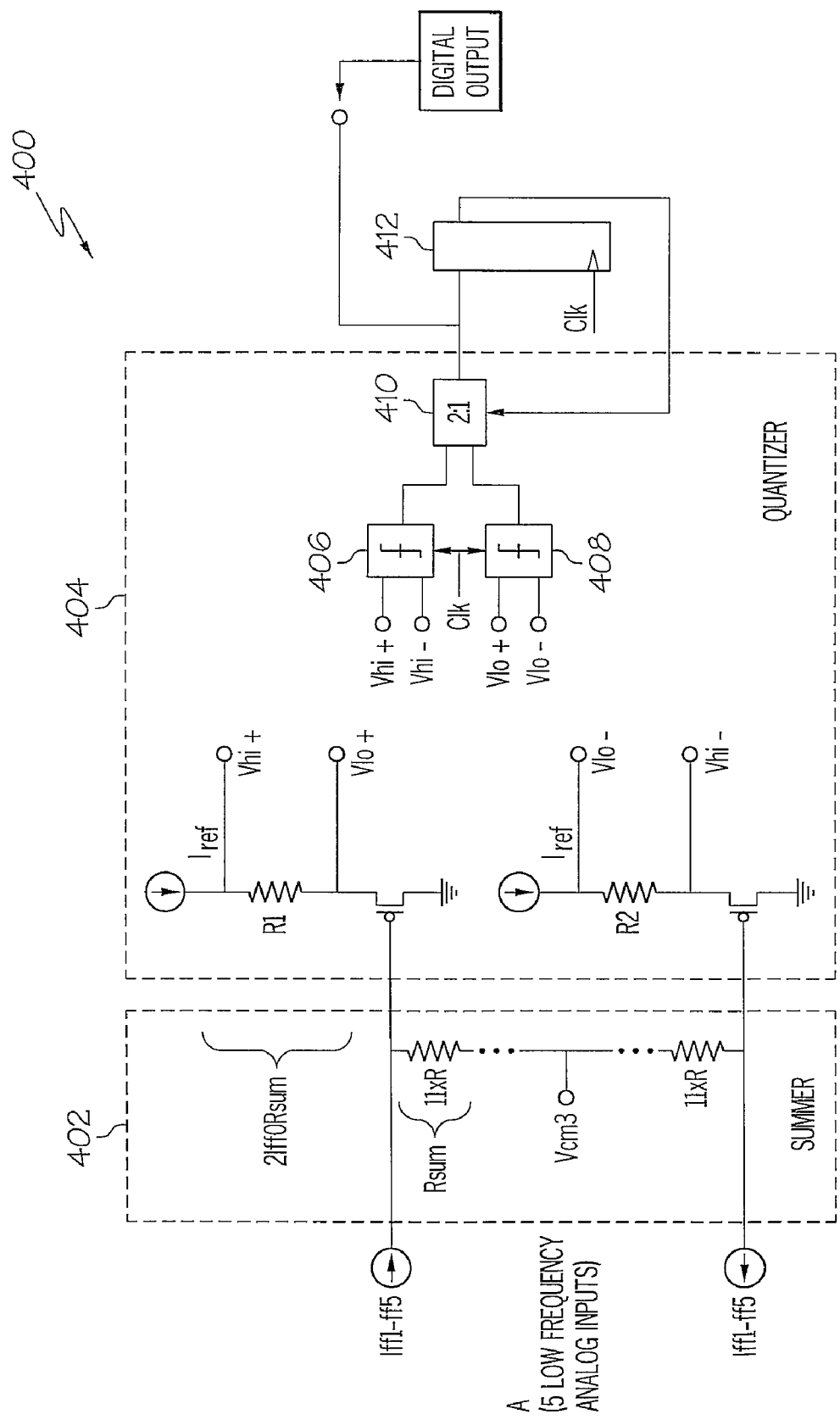
FIG. 4 is a diagram of a relevant portion of an example analog summer and quantizer circuit of a continuous-time sigma-delta modulator that is configured according to one embodiment of the present invention.

With reference to FIG. 4, a relevant portion of a continuous-time sigma-delta modulator 400 that implements delay compensation, according to one embodiment of the present disclosure, is illustrated. The modulator 400, which includes a summer 402 and a quantizer circuit 404, provides one example of how the summer 304 and the quantizer circuit 306 may be implemented, when the summer 304 includes five inputs and the quantizer circuit 306 is a 1-bit quantizer (i.e., n=1). The summer 402, which is arranged in a resistor ladder structure, includes five low frequency analog inputs (not all of which are shown) for receiving and summing analog inputs (provided from an analog loop filter and represented as input currents Iff1-ff5). As is shown, outputs of the summer 402 are coupled to inputs of a resistor ladder structure of the quantizer circuit 404. The resistor ladder structure provides reference voltage pairs (Vhi+,Vhi−) and (Vlo+,Vlo−) for quantizers 406 and 408, respectively, which are included in the quantizer circuit 404. As is illustrated, the quantizer circuit 404 is a 1-bit quantizer that provides either a digital zero '0' or a digital one '1' responsive to analog input signals.

As shown in FIG. 4, the compensatory digital feedback signal D3 (which corresponds to either a digital '0' or a digital '1', depending on the delayed digital output signal) is provided to a select input of a multiplexer 410, which selects one of the quantizers 406 and 408 responsive to the digital output signal (which is provided at an input of latch 412) or more precisely the compensatory digital feedback signal D3. The quantizer 406 has a reference voltage pair having first values (i.e., at Vhi+ and Vhi−) and the quantizer 408 has a reference voltage pair having second values (i.e., at Vlo+ and Vlo−). One of the quantizers 406 and 408 is selected (based on the digital output signal) to quantize an analog input signal. For example, Vhi+ may be 2.00 volts and Vhi− may be 1.25 volts (assumes a 0.25 volt drop across resistor R1, a 0.25 volt drop across the resistor Rsum, and a Vcm3 of 1.5 volts) and Vlo+ may be 1.75 volts and Vlo− may be 1.5 volts (assumes a 0.25 volt drop across resistor R2, a 0.25 volt drop across the resistor Rsum, and a Vcm3 of 1.5 volts).

In this case, assuming that the quantizer 406 is selected, as Vhi+−Vhi−>0, the quantizer 406 provides a digital '1'. When Vhi+−Vhi−<0, the quantizer 406 provides a digital '0'. Similarly, assuming that the quantizer 408 is selected, as Vlo+−Vlo−>0, the quantizer 408 provides a digital '1'. When Vlo+−Vlo−<0, the quantizer 408 provides a digital '0'. In this manner, an appropriate one of the quantizers (having an appropriate reference voltage pair) may be selected (based on the digital output signal). In a typical case, when the feedback signal D3 is a digital '1', the quantizer 408 (which has a differential voltage threshold of 0.25 volts) is selected. Similarly when the feedback signal D3 is a digital '0', the quantizer 406 (which has a differential voltage threshold of 0.75 volts) is selected.

Figure 2:
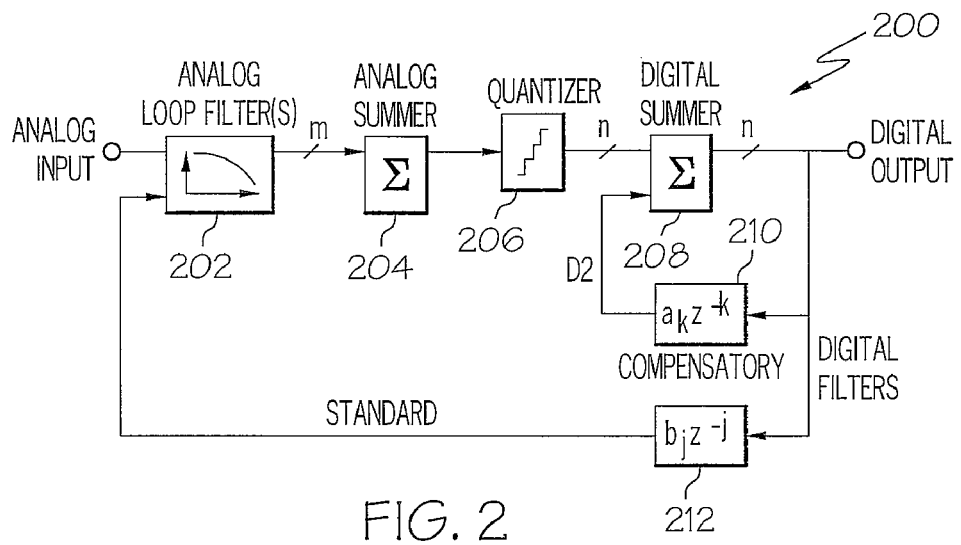
FIG. 2 is an example diagram of a relevant portion of another conventional continuous-time sigma-delta modulator.

It should be appreciated that changing an offset of a reference voltage or reference voltage pair of a quantizer (that quantizes an analog input signal) achieves compensatory feedback while reducing both high analog performance requirements and digital/analog scaling issues, as compared to the conventional continuous-time sigma-delta modulators of FIG. 1 and FIG. 2, respectively. That is, offsetting a reference voltage or a reference voltage pair of a quantizer achieves substantially the same result as adding the compensatory signal D1 to the analog input signal using the summer 104 of FIG. 1 or adding the compensatory signal D2 to the digital input signal using the summer 208 of FIG. 2, without incurring the high analog performance requirements of the summer 104 or the digital/analog scaling issues of the summer 208. It should be appreciated that the quantizer circuit 404 implements a time delay of one clock (Clk) cycle as the latch 412 corresponds to the block 308 of FIG. 3, with the weighting factor $a_k$ in this case being set by changing a reference current (Iref) to a desired value and/or setting resistors R1 and R2 to desired values.

Figure 5:
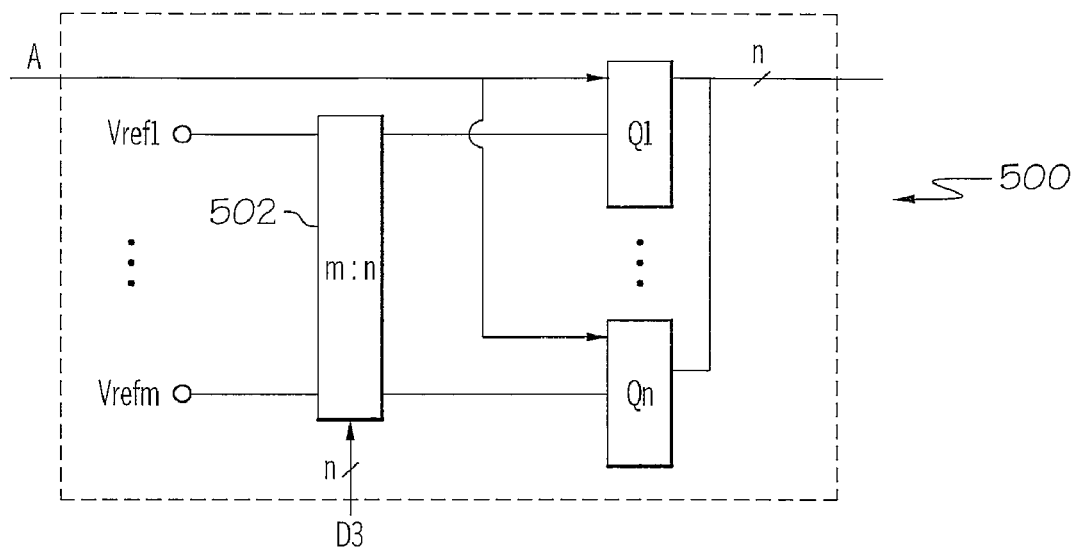
FIG. 5 is a diagram of a relevant portion of an example quantizer circuit configured according to one embodiment of the present invention.

With reference to FIG. 5, a quantizer circuit 500 is illustrated that may be employed in the continuous-time sigma-delta modulator 300 of FIG. 3. That is, the quantizer circuit 500 may replace the quantizer circuit 306. The quantizer circuit 500 includes a digital selector 502 (in this case an m:n selector) that selects a reference voltage (one of Vref1 through Vrefm) or a voltage reference pair (depending on whether the quantizer circuit 500 is single-ended or differential), based on a digital output signal, to provide a reference voltage (or a voltage reference pair) for each quantizer (i.e., quantizers Q1-Qn which correspond to a quantizer for each bit in an n-bit digital output signal). For a 1-bit quantizer, a single quantizer (e.g., the quantizer Q1) is implemented. For a 2-bit quantizer, two quantizers are implemented (e.g., the quantizer Q1 and a quantizer Q2). Similarly, for an 'n' bit quantizer, 'n' quantizers are implemented in the quantizer circuit 500.

In the discussion below, an assumption is made that a threshold is originally set at zero for a reference voltage pair. A reference voltage pair for a 1-bit quantizer may correspond to +2.0 volts and −1.0 volts (which corresponds to a voltage reference pair of 1.5 volts and −1.5 volts offset by +0.5 volts). In this case, a value of the compensatory digital feedback signal D3 corresponds to an offset of +0.5 volts (e.g. a 1-bit signal that corresponds to a digital '1' causes the voltage reference pair to be offset by +0.5 volts). As another example, a voltage reference pair for a 1-bit quantizer may correspond to +1.0 volts and −2.0 volts (which corresponds to a voltage reference pair of 1.5 volts and −1.5 volts offset by −0.5 volts). In this case, the compensatory digital feedback signal D3 corresponds to an offset of −0.5 volts (e.g. a 1-bit signal that corresponds to a digital '0' causes the voltage reference pair to be offset by −0.5 volts). As another example, assuming the quantizer circuit 500 is configured to provide 2-bits and the quantizers Q1 to Q2 (i.e., 'n' is equal to two) are single-ended, the digital selector 502 selects an appropriate voltage reference for each of the quantizers Q1 and Q2 to quantize an analog input signal based on the digital output signal.

Figure 6:
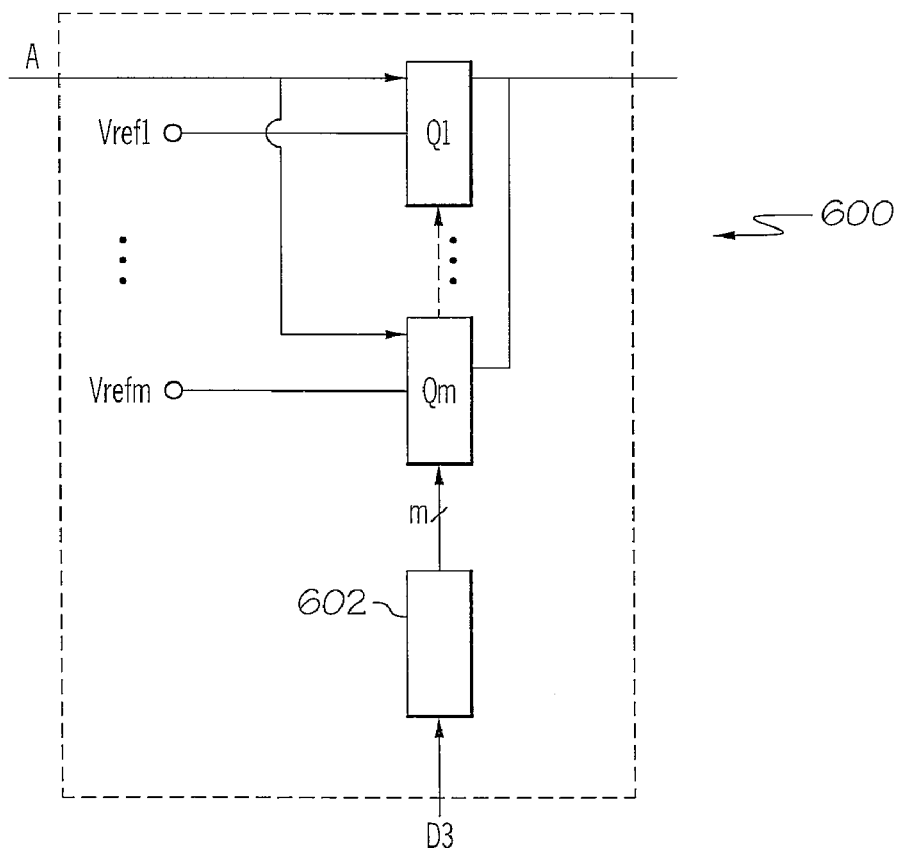
FIG. 6 is a diagram of a relevant portion of an example quantizer circuit configured according to another embodiment of the present invention.

With reference to FIG. 6, a quantizer circuit 600 is illustrated that may be employed in the continuous-time sigma-delta modulator 300 of FIG. 3 to take the place of the quantizer circuit 306. The quantizer circuit 600 includes multiple quantizers (each which have different reference voltages or different reference voltage pairs) that are implemented to generate all possible outcomes. For sake of clarity, a quantizer circuit having a single output is described. It should, however, be appreciated that the circuit 600 may generalized for a quantizer circuit having two or more outputs, in which case an output selector may be employed to select quantizers to provide the two or more outputs. In the case of a quantizer circuit having a single output, digital selection is utilized to choose which one of quantizers Q1-Qm to enable at a given point in time. The quantizer circuit 600 includes an m-level decoder 602 that selects one of the quantizers Q1-Qm, each of which have a different associated reference voltage or a voltage reference pair (labeled Vref1 through Vrefm), based on a digital output signal.

Unlike the quantizer circuit 500 of FIG. 5, the quantizer circuit 600 includes multiple quantizers (Q1-Qm) that each have a different associated reference voltage (or a different associated voltage reference pair) for a 1-bit quantizer, as contrasted with selecting a different reference voltage (or a different voltage reference pair) for a single quantizer (associated with each bit) based on a digital output signal. In various embodiments, only one of the quantizers Q1-Qm is powered when the quantizer circuit 600 provides a 1-bit output. For example, the quantizer Q1 may have an associated reference voltage pair of +1.7 volts and −1.3 volts (which may correspond to a voltage reference pair of 1.5 volts and −1.5 volts offset by +0.2 volts). As another example, a quantizer Q2 may have an associated voltage reference pair of +1.3 volts and −1.7 volts (which may correspond to a voltage reference pair of 1.5 volts and −1.5 volts offset by −0.2 volts). It should be appreciated that the quantizers Q1 and Q2 essentially add a different compensation value (based on a digital output signal) to an analog input signal, due to the different voltage reference pairs of the quantizers Q1 and Q2, to achieve compensatory feedback.

Figure 7:
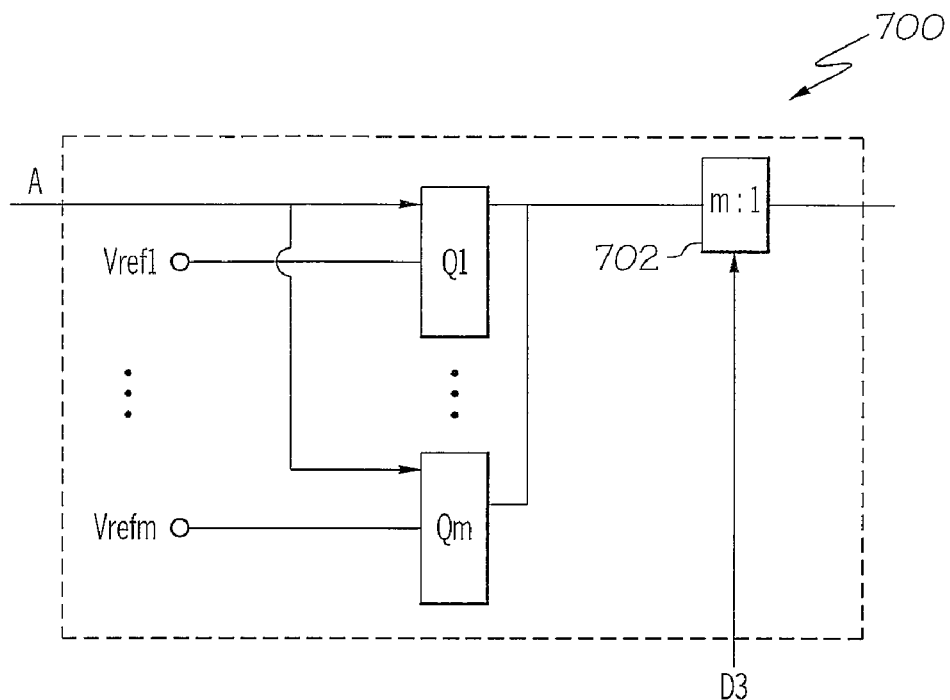
FIG. 7 is a diagram of a relevant portion of an example quantizer circuit configured according to yet another embodiment of the present invention.

With reference to FIG. 7, a quantizer circuit 700 is illustrated that may be employed in the continuous-time sigma-delta modulator 300 of FIG. 3. That is, the quantizer circuit 700 may replace the quantizer circuit 306. The quantizer circuit 700 includes a digital selector 702 (i.e., a m:1 selector) that selects an output of one of quantizers Q1-Qm (each of which have an associated reference voltage or an associated voltage reference pair, i.e., one of Vref1 through Vrefin), based on a digital output signal. It should be appreciated that the quantizer circuit 700 may be readily generalized to include a selector that provides an n-bit output. Unlike the quantizer circuit 500 of FIG. 5, the quantizer circuit 700 includes multiple quantizers (for each bit) that each have a different associated reference voltage (or an associated voltage reference pair), as contrasted with selecting a different reference voltage (or different reference voltage pair) for a single quantizer based on a digital output signal. In this case, an output of an appropriate quantizer Q1-Qm is selected based on a digital output signal. Unlike the quantizer circuit 600, whose quantizers are typically only powered when enabled, the quantizers Q1-Qm of the quantizer circuit 700 are typically always powered.

The quantizer Q1 may have an associated reference voltage pair of +3.0 volts and −2.0 volts (which may correspond to a voltage reference pair of 2.5 volts and −2.5 volts offset by +0.5 volts) and may be selected when the digital output signal is a digital '1'. As another example, the quantizer Q2 may have an associated voltage reference pair of +2.0 volts and −3.0 volts (which may correspond to a voltage reference pair of 2.5 volts and −2.5 volts offset by −0.5 volts) and may be selected when the digital output signal is a digital '0'. The quantizers in the various embodiments may be realized by noise regenerative latches (e.g., static random access memory (SRAM) bit cells that are set at mid-rail and employ positive feedback). An associated clock of the latches may, for example, be gated to enable and disable the latches. In another embodiment, the functionality of the quantizer circuits 600 and 700 may be combined. For example, the digital selector 602 may be implemented in the quantizer 700 to select one of quantizers Q1-Qm.

Figure 8:
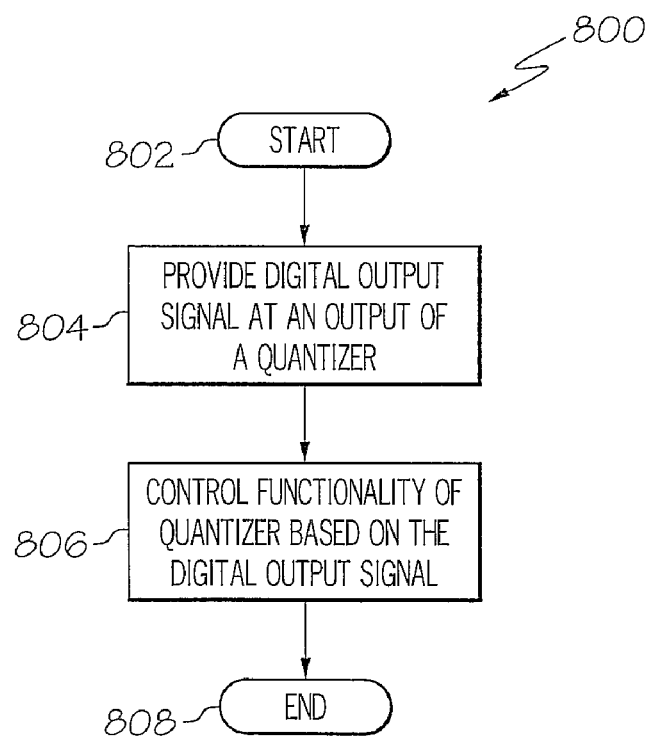
FIG. 8 is a flowchart of an example delay compensation process, according to an embodiment of the present invention.

With reference to FIG. 8, an example delay compensation process 800, which is configured according to one embodiment of the present disclosure, is illustrated. For discussion purposes, the process 800 is discussed in conjunction with the modulator 300 of FIG. 3. The process 800 is initiated in block 802, at which point control transfers to block 804. In block 804, a digital output signal is provided at an output of the quantizer circuit 306. Next, in block 806, functionality of the quantizer circuit 306 is controlled based on, for example, a present and previous digital output signal. In this case, it should be appreciated that the quantizer circuit 306 would typically be capable of storing and adding present and previous digital output signals. From block 806, control transfers to block 808 where the process 800 terminates (until called again) and returns to a calling routine. Advantageously, employing the disclosed techniques facilitate design of devices (e.g., analog-to-digital converters (ADCs) and digital-to-analog converters (DACs)) that consume less power when implementing compensatory feedback since an associated analog summer, when implemented, does not process high frequency digital signals. Moreover, employing the disclosed techniques facilitates design of devices that exhibit better performance when implementing compensatory feedback, as analog summer bandwidth has previously limited clocking frequency.

As may be used herein, a software system can include one or more objects, agents, threads, subroutines, separate software applications, two or more lines of code or other suitable software structures operating in one or more separate software applications, on one or more different processors, or other suitable software architectures.

As will be appreciated, the processes in preferred embodiments of the present invention may be implemented using a combination of computer programming software (such as design files), firmware or hardware. As a preparatory step to practicing the invention in software, the computer programming code (whether software or firmware) according to a preferred embodiment will typically be stored in one or more machine readable storage mediums such as fixed (hard) drives, diskettes, optical disks, magnetic tape, semiconductor memories such as read-only memories (ROMs), programmable ROMs (PROMs), etc., thereby making an article of manufacture in accordance with the invention. The article of manufacture containing the computer programming code is used by either executing the code directly from the storage device, by copying the code from the storage device into another storage device such as a hard disk, random access memory (RAM), etc., or by transmitting the code for remote execution. The method form of the invention may be practiced by combining one or more machine-readable storage devices containing the code according to the present invention with appropriate standard computer hardware to execute the code contained therein. An apparatus for practicing the invention could be one or more computers and storage systems containing or having network access to computer program(s) coded in accordance with the invention.

Although the invention is described herein with reference to specific embodiments, various modifications and changes can be made without departing from the scope of the present invention as set forth in the claims below. For example, many of the techniques disclosed herein are broadly applicable to a variety of devices that may be employed in various systems. Accordingly, the specification and figures are to be regarded in an illustrative rather than a restrictive sense, and all such modifications are intended to be included with the scope of the present invention. Any benefits, advantages, or solution to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of implementing compensatory feedback in a continuous-time sigma-delta modulator, comprising:
providing, based on an analog input signal, a digital output signal at an output of a quantizer circuit of the continuous-time sigma-delta modulator; and
controlling a functionality of the quantizer circuit based on the digital output signal by selecting an output of one of multiple quantizers, included within the quantizer circuit, to be coupled to the output of the quantizer circuit based on a delayed version of the digital output signal, wherein the one of the multiple quantizers whose output is selected quantizes a subsequent analog input signal, and wherein each of the multiple quantizers has different associated reference voltage pairs.

2. The method of claim 1, wherein the quantizer circuit implements a resistor ladder structure.

3. The method of claim 1, wherein the quantizer circuit is a one-bit quantizer.

4. The method of claim 1, wherein the quantizer circuit is a multiple-bit quantizer.

5. A continuous-time sigma-delta modulator, comprising:
an analog loop filter including an input configured to receive an analog input signal and an analog output; and
a quantizer circuit including a first input coupled to the analog output of the analog loop filter, an output configured to provide a digital output signal, and a second input configured to receive a delayed scaled version of the digital output signal, wherein the quantizer circuit is further configured to modify its functionality based on the delayed scaled version of the digital output signal by enabling one of multiple quantizers, included in the quantizer circuit, to quantize a subsequent analog input signal based on the delayed scaled version of the digital output signal, and wherein each of the multiple quantizers has a different associated reference voltage.

6. The continuous-time sigma-delta modulator of claim 5, wherein the analog output includes two or more analog outputs and the continuous-time sigma-delta modulator further comprises:
an analog summer including two or more analog inputs coupled to respective ones of the two or more analog outputs and an analog output coupled to the first input of the quantizer circuit.

7. The continuous-time sigma-delta modulator of claim 5, wherein the quantizer circuit implements a resistor ladder structure.

8. The continuous-time sigma-delta modulator of claim 5, wherein the quantizer circuit is a one-bit quantizer circuit.

9. The continuous-time sigma-delta modulator of claim 5, wherein the quantizer circuit is a multiple-bit quantizer circuit.

10. A method of implementing compensatory feedback in a sigma-delta modulator, comprising:
providing, based on an analog input signal, a digital output signal at an output of a quantizer circuit of the sigma-delta modulator;
selecting an output of one of multiple quantizers, included within the quantizer circuit, to be coupled to the output of the quantizer circuit based on a delayed version of the digital output signal, wherein each of the multiple quantizers has different associated reference voltage pairs; and
quantizing a subsequent analog input signal using the one of the multiple quantizers that is associated with the selected output.

11. The method of claim 10, wherein the quantizer circuit implements a resistor ladder structure.

12. The method of claim 10, wherein the quantizer circuit is a multiple-bit quantizer.

* * * * *